(12) United States Patent
Branson et al.

(10) Patent No.: US 9,020,785 B2
(45) Date of Patent: *Apr. 28, 2015

(54) IDENTIFYING AND ROUTING POISON TUPLES IN A STREAMING APPLICATION

(71) Applicant: International Business Machines Corporation, Armonk, NY (US)

(72) Inventors: Michael J. Branson, Rochester, MN (US); John M. Santosuosso, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 172 days.

This patent is subject to a terminal disclaimer.

(21) Appl. No.: 13/672,824

(22) Filed: Nov. 9, 2012

(65) Prior Publication Data

US 2014/0136175 A1    May 15, 2014

(51) Int. Cl.
*G06F 7/60*    (2006.01)
*G06F 17/10*    (2006.01)
*G06F 17/50*    (2006.01)

(52) U.S. Cl.
CPC ................... *G06F 17/5009* (2013.01)

(58) Field of Classification Search
CPC .................................................. G06F 17/5009
USPC ............................................ 703/2; 714/47.1
See application file for complete search history.

(56) References Cited

U.S. PATENT DOCUMENTS

| | | | |
|---|---|---|---|
| 7,424,409 B2 * | 9/2008 | Ben-Gal et al. .................. 703/2 |
| 7,613,848 B2 | 11/2009 | Amini et al. | |
| 7,644,110 B2 | 1/2010 | Nishizawa et al. | |
| 7,730,364 B2 * | 6/2010 | Chang et al. .................. 714/47.2 |
| 8,095,690 B2 | 1/2012 | Kashiyama et al. | |
| 2006/0064438 A1 | 3/2006 | Aggarwal | |
| 2007/0016938 A1 | 1/2007 | Lin | |
| 2010/0324869 A1 * | 12/2010 | Cherkasova et al. .............. 703/2 |
| 2012/0047101 A1 | 2/2012 | Branson et al. | |
| 2012/0218268 A1 | 8/2012 | Accola et al. | |
| 2013/0185038 A1 * | 7/2013 | Radu et al. ....................... 703/2 |

OTHER PUBLICATIONS

Mallick et al. "A Resource Prediction Model for Virtualization Servers"., Dec. 2011, LACL, 25 Pages.*
Ballard et al., "IBM InfoSphere Streams: Harnessing Data in Motion", Sep. 2010. 360 pages, IBM Redbooks. http://www.redbooks.ibm.com/abstracts/sg247865.html.
Santosuosso et al., "Management System for Processing Streaming Data", U.S. Appl. No. 13/190,810, filed Jul. 26, 2011. IBM.

(Continued)

*Primary Examiner* — Eun Kim
(74) *Attorney, Agent, or Firm* — Jonathan V. Sry; James R. Nock (57) ABSTRACT

A method for processing a stream of tuples may comprise receiving a stream of tuples to be processed by a plurality of processing elements operating on one or more computer processors. In addition, the method may include generating a model of performance for processing the stream of tuples at runtime, wherein one or more tuples from the stream of tuples potentially cause adverse performance. Further, the method may comprise predicting a parameter for a tuple from the stream of tuples, the parameter indicating a potential for adverse performance, the predicting including using the model. The method may also include modifying processing of the tuple if the parameter falls outside a threshold.

14 Claims, 8 Drawing Sheets

(56) References Cited

OTHER PUBLICATIONS

U.S. Appl. No. 13/334,399, entitled "Detecting and Resolving Errors Within an Application," filed Dec. 22, 2011 by Michael J. Branson et al.

Alves R.M.B and Nascimento, C.A.O., "Gross Errors Detection of Industrial Data by Neural Network and Cluster Techniques", Brazillian Journal of Chemical Engineering. Oct.-Dec. 2002, (received Mar. 5, 2002, accepted Jun. 21, 2002), vol. 19, No. 4, pp. 483-489.

Cui et al., "Data Discrimination in Fault-Prone Sensor Networks", Wireless Sensor Network, 2010, 2, pp. 285-292. © 2010 Scientific Research, (received Jan. 31, 2010, revised Feb. 22, 2010, accepted Feb. 24, 2010), DOI 10.4236/wsn.2010.24039.

Zheng et al., "BigSim: A Parallel Simulator for Performance Prediction of Extremely Large Parallel Machines", Proceedings of the 18th International and Distributed Processing Symposium (IPDPS'04), IEEE, 10 pages.

U.S. Appl. No. 13/706,143 entitled "Detecting and Resolving Errors Within an Application", filed Dec. 5, 2012 by Michael J. Branson et al., IBM.

U.S. Appl. No. 13/784,141 entitled "Identifying and Routing Poison Tuples in a Streaming Application", filed Mar. 4, 2013 by Michael J. Branson et al., IBM.

* cited by examiner

IDENTIFYING AND ROUTING POISON TUPLES IN A STREAMING APPLICATION

TECHNICAL FIELD

This disclosure generally relates to stream computing, and in particular, to computing applications that receive streaming data and process the data as it is received.

BACKGROUND

Database systems are typically configured to separate the process of storing data from accessing, manipulating, or using data stored in a database. More specifically, database systems use a model in which data is first stored and indexed in a memory before subsequent querying and analysis. In general, database systems may not be well suited for performing real-time processing and analyzing streaming data. In particular, database systems may be unable to store, index, and analyze large amounts of streaming data efficiently or in real time.

SUMMARY

Embodiments of the disclosure provide a method, system, and computer program product for processing data. The method, system, and computer program receive streaming data to be processed by a plurality of processing elements comprising one or more stream operators.

One embodiment is directed to a method for processing a stream of tuples. The method may comprise receiving a stream of tuples to be processed by a plurality of processing elements operating on one or more computer processors. In addition, the method may include generating a model of performance for processing the stream of tuples at runtime, wherein one or more tuples from the stream of tuples potentially cause adverse performance. Further, the method may comprise predicting a parameter for a tuple from the stream of tuples, the parameter indicating a potential for adverse performance, the predicting including using the model. The method may also include modifying processing of the tuple if the parameter falls outside a threshold. In one embodiment, the parameter indicates actual adverse performance of the tuple.

Another embodiment is directed to a system for processing a stream of tuples in a stream-based application.

Yet another embodiment is directed to a computer program product.

BRIEF DESCRIPTION OF THE DRAWINGS

Like reference numbers and designations in the various drawings indicate like elements.

DETAILED DESCRIPTION

Stream-based computing and stream-based database computing are emerging as a developing technology for database systems. Products are available which allow users to create applications that process and query streaming data before it reaches a database file. With this emerging technology, users can specify processing logic to apply to inbound data records while they are "in flight," with the results available in a very short amount of time, often in fractions of a second. Constructing an application using this type of processing has opened up a new programming paradigm that will allow for development of a broad variety of innovative applications, systems, and processes, as well as present new challenges for application programmers and database developers.

In a stream-based computing application, stream operators are connected to one another such that data flows from one stream operator to the next (e.g., over a TCP/IP socket). Scalability is achieved by distributing an application across nodes by creating executables (i.e., processing elements), as well as replicating processing elements on multiple nodes and load balancing among them. Stream operators in a stream computing application can be fused together to form a processing element that is executable. Doing so allows processing elements to share a common process space, resulting in much faster communication between stream operators than is available using inter-process communication techniques (e.g., using a TCP/IP socket). Further, processing elements can be inserted or removed dynamically from an operator graph representing the flow of data through the stream computing application.

A "tuple" is data. More specifically, a tuple is a sequence of one or more attributes associated with a thing. Examples of attributes may be any of a variety of different types, e.g., integer, float, Boolean, string, etc. The attributes may be ordered. A tuple may be extended by adding one or more additional attributes to it. In addition to attributes associated with a thing, a tuple may include metadata, i.e., data about the tuple. As used herein, "stream" or "data stream" refers to a sequence of tuples. Generally, a stream may be considered a pseudo-infinite sequence of tuples.

Stream computing applications handle massive volumes of data that need to be processed efficiently and in real time. For example, a stream computing application may continuously ingest and analyze hundreds of thousands of messages per second and up to petabytes of data per day. Accordingly, each stream operator in a stream computing application may be required to process a received tuple within fractions of a second.

A poison tuple may be any tuple that has one or more attributes with values that could cause a stream operator to adversely affect the stream operator's performance, e.g., crashing the system, or slowing system performance, with respect to a particular parameter threshold. Examples of poison tuples may include a tuple with a binary attribute that is corrupt, a tuple that contains a bad URL that points to a slow or unreliable website, or a tuple with sensor data that is significantly inconsistent in consecutive readings, or a tuple that would approach a time parameter threshold. A poison tuple may slow system performance as a result of processing the tuple, for example, on an operator graph. According to various embodiments, a management system may be configured to identify a poison tuple and isolate a tuple from a primary execution path.

A suspect poison tuple may be a tuple that has one or more attributes that could potentially cause a stream operator to adversely affect the stream operator's performance, e.g., crashing the system, or slowing system performance, with respect to a particular parameter threshold. An example of a suspect poison tuple may include a tuple without enough data to indicate that it would be a poison tuple but with enough data to indicate that it could slow performance.

Figure 1:
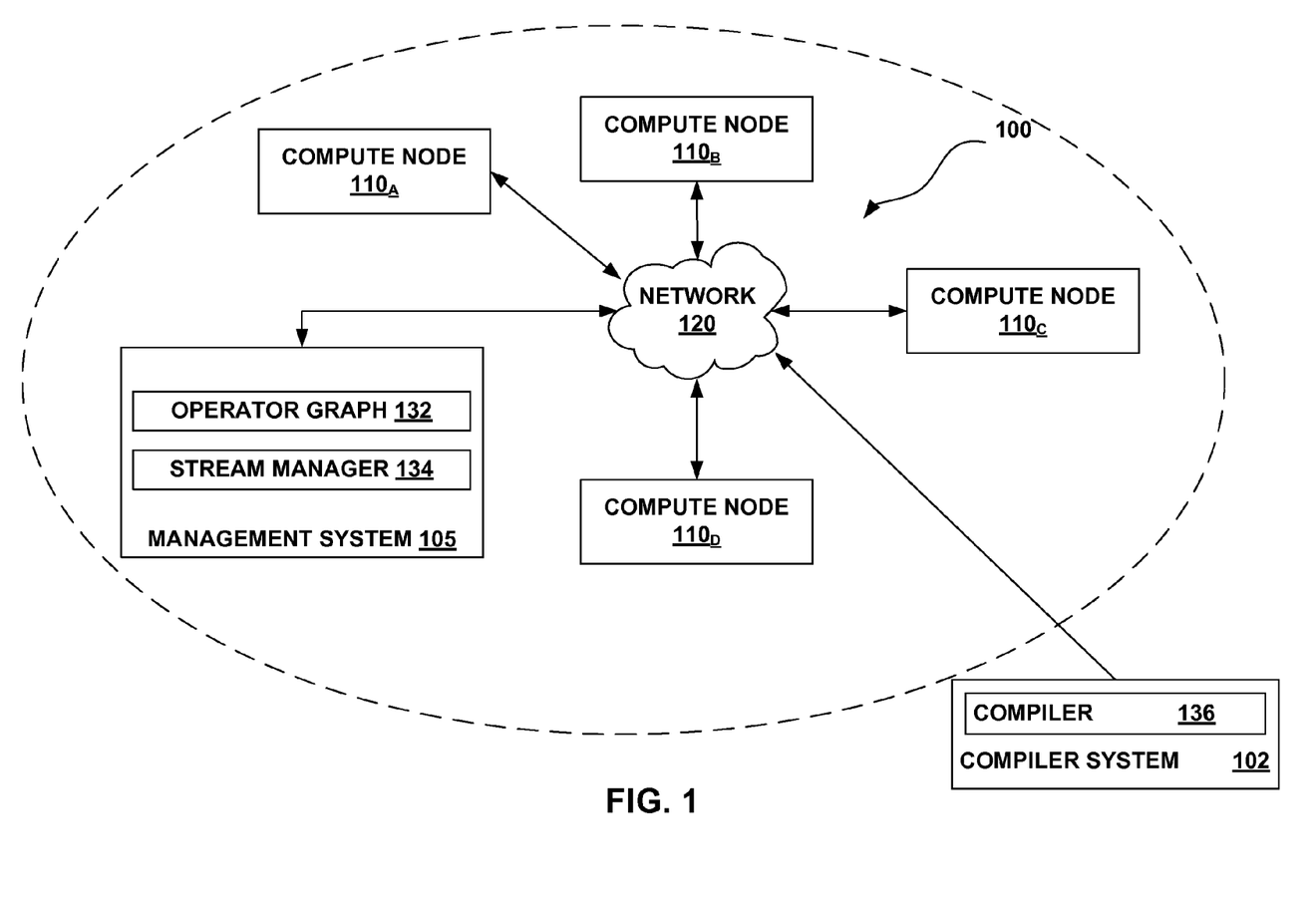
FIG. 1 illustrates a computing infrastructure configured to execute a stream computing application according to various embodiments.

FIG. 1 illustrates one exemplary computing infrastructure 100 that may be configured to execute a stream-based computing application, according to some embodiments. The computing infrastructure 100 includes a management system 105 and two or more compute nodes 110A-110D—i.e., hosts—which are communicatively coupled to each other using one or more communications networks 120. The communications network 120 may include one or more servers, networks, or databases, and may use a particular communication protocol to transfer data between the compute nodes 110A-110D. A compiler system 102 may be communicatively coupled with the management system 105 and the compute nodes 110 either directly or via the communications network 120.

Figure 2:
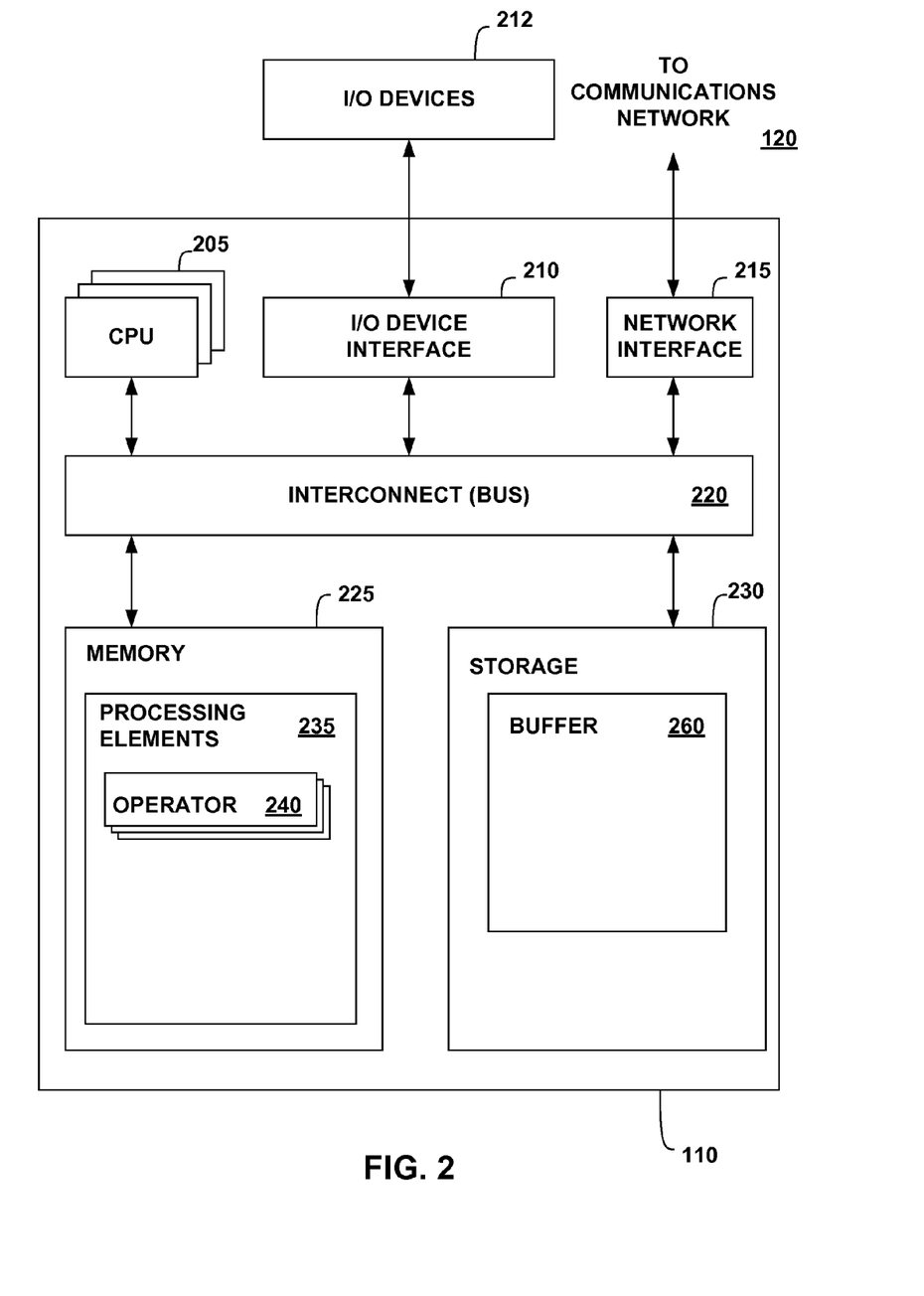
FIG. 2 illustrates a more detailed view of a compute node of FIG. 1 according to various embodiments.

FIG. 2 is a more detailed view of a compute node 110, which may be the same as one of the compute nodes 110A-110D of FIG. 1, according to various embodiments. The compute node 110 may include, without limitation, one or more processors (CPUs) 205, a network interface 215, an interconnect 220, a memory 225, and a storage 230. The compute node 110 may also include an I/O device interface 210 used to connect I/O devices 212, e.g., keyboard, display, and mouse devices, to the compute node 110.

Each CPU 205 retrieves and executes programming instructions stored in the memory 225 or storage 230. Similarly, the CPU 205 stores and retrieves application data residing in the memory 225. The interconnect 220 is used to transmit programming instructions and application data between each CPU 205, I/O device interface 210, storage 230, network interface 215, and memory 225. The interconnect 220 may be one or more busses. The CPUs 205 may be a single CPU, multiple CPUs, or a single CPU having multiple processing cores in various embodiments. In one embodiment, a processor 205 may be a digital signal processor (DSP). One or more processing elements 235 (described below) may be stored in the memory 225. A processing element 235 may include one or more stream operators 240 (described below). In one embodiment, a processing element 235 is assigned to be executed by only one CPU 205, although in other embodiments the stream operators 240 of a processing element 235 may include one or more threads that are executed on two or more CPUs 205. The memory 225 is generally included to be representative of a random access memory, e.g., Static Random Access Memory (SRAM), Dynamic Random Access Memory (DRAM), or Flash. The storage 230 is generally included to be representative of a non-volatile memory, such as a hard disk drive, solid state device (SSD), or removable memory cards, optical storage, flash memory devices, network attached storage (NAS), or connections to storage area network (SAN) devices, or other devices that may store non-volatile data. The network interface 215 is configured to transmit data via the communications network 120.

A streams application may include one or more stream operators 240 that may be compiled into a "processing element" container 235. The memory 225 may include two or more processing elements 235, each processing element having one or more stream operators 240. Each stream operator 240 may include a portion of code that processes tuples flowing into a processing element and outputs tuples to other stream operators 240 in the same processing element, in other processing elements, or in both the same and other processing elements in a stream computing application. Processing elements 235 may pass tuples to other processing elements that are on the same compute node 110 or on other compute nodes that are accessible via communications network 120. For example, a processing element 235 on compute node 110A may output tuples to a processing element 235 on compute node 110B.

The storage 230 may include a buffer 260. Although shown as being in storage, the buffer 260 may be located in the memory 225 of the compute node 110 or in a combination of both memories. Moreover, storage 230 may include storage space that is external to the compute node 110, such as in a cloud.

Figure 3:
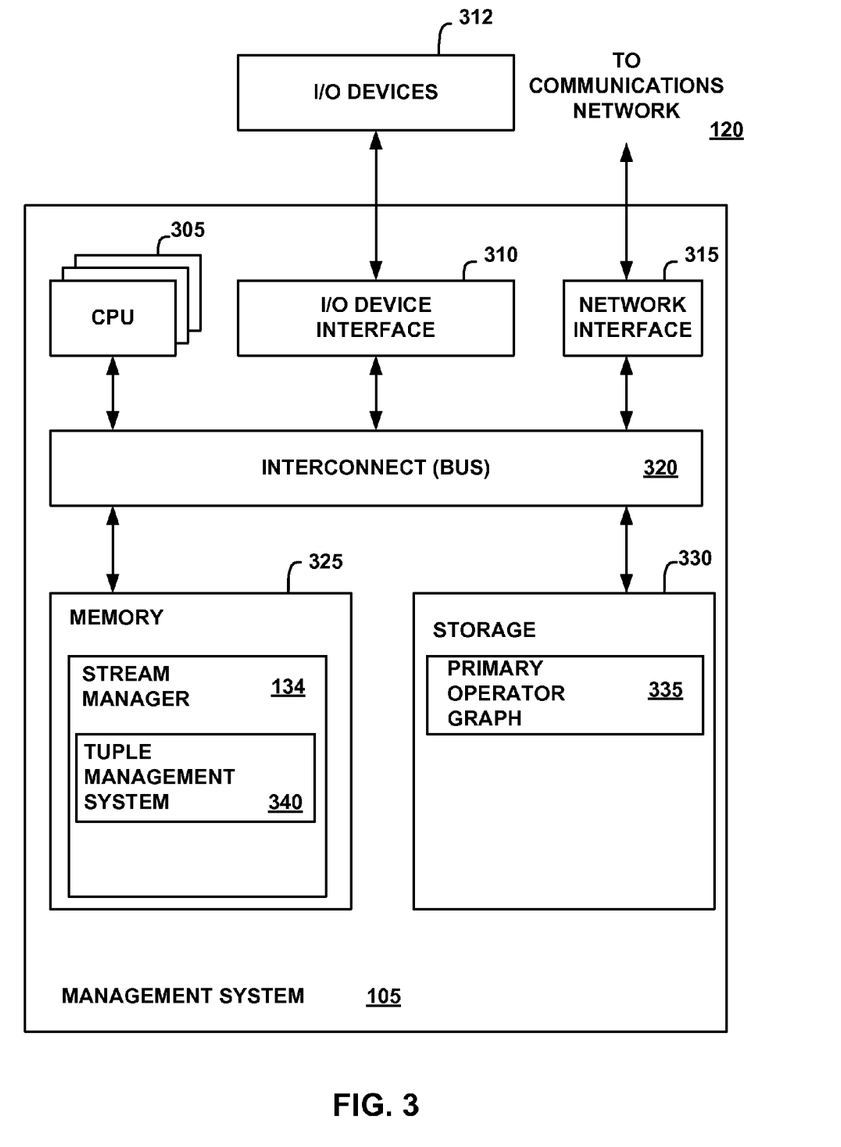
FIG. 3 illustrates a more detailed view of the management system of FIG. 1 according to various embodiments.

FIG. 3 is a more detailed view of the management system 105 of FIG. 1 according to some embodiments. The management system 105 may include, without limitation, one or more processors (CPUs) 305, a network interface 315, an interconnect 320, a memory 325, and a storage 330. The management system 105 may also include an I/O device interface 310 connecting I/O devices 312, e.g., keyboard, display, and mouse devices, to the management system 105.

Each CPU 305 retrieves and executes programming instructions stored in the memory 325 or storage 330. Similarly, each CPU 305 stores and retrieves application data residing in the memory 325 or storage 330. The interconnect 320 is used to move data, such as programming instructions and application data, between the CPU 305, I/O device interface 310, storage unit 330, network interface 305, and memory 325. The interconnect 320 may be one or more busses. The CPUs 305 may be a single CPU, multiple CPUs, or a single CPU having multiple processing cores in various embodiments. In one embodiment, a processor 305 may be a DSP. Memory 325 is generally included to be representative of a random access memory, e.g., SRAM, DRAM, or Flash. The storage 330 is generally included to be representative of a non-volatile memory, such as a hard disk drive, solid state device (SSD), removable memory cards, optical storage, flash memory devices, network attached storage (NAS), connections to storage area-network (SAN) devices, or the cloud. The network interface 315 is configured to transmit data via the communications network 120.

The memory 325 may store a stream manager 134. The stream manager 134 may be a part of the management system 105. The stream manager 134 may also contain a tuple management system 340, which is described further in FIG. 6. The tuple management system (TMS) 340 may stand alone or may be a part of a particular compute node. Additionally, the storage 330 may store an operator graph 335. The operator graph 335 may define how tuples are routed to processing elements 235 (FIG. 2) for processing.

Figure 4:
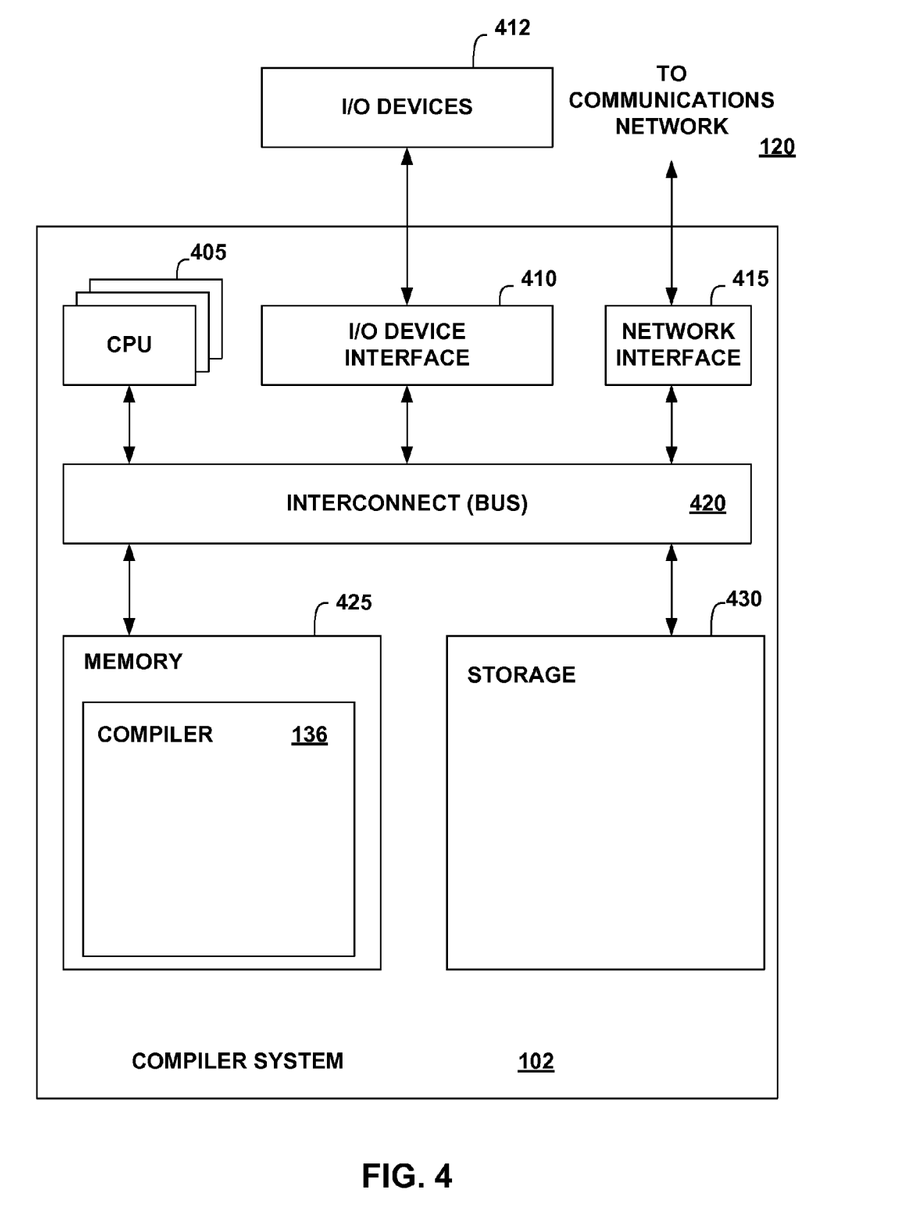
FIG. 4 illustrates a more detailed view of the compiler system of FIG. 1 according to various embodiments.

FIG. 4 is a more detailed view of the compiler system 102 of FIG. 1 according to some embodiments. The compiler system 102 may include, without limitation, one or more processors (CPUs) 405, a network interface 415, an interconnect 420, a memory 425, and storage 430. The compiler system 102 may also include an I/O device interface 410 connecting I/O devices 412, e.g., keyboard, display, and mouse devices, to the compiler system 102.

Each CPU 405 retrieves and executes programming instructions stored in the memory 425 or storage 430. Similarly, each CPU 405 stores and retrieves application data residing in the memory 425 or storage 430. The interconnect 420 is used to move data, such as programming instructions and application data, between the CPU 405, I/O device interface 410, storage unit 430, network interface 415, and memory 425. The interconnect 420 may be one or more busses. The CPUs 405 may be a single CPU, multiple CPUs, or a single CPU having multiple processing cores in various embodiments. In one embodiment, a processor 405 may be a DSP. Memory 425 is generally included to be representative of a random access memory, e.g., SRAM, DRAM, or Flash. The storage 430 is generally included to be representative of a non-volatile memory, such as a hard disk drive, solid state device (SSD), removable memory cards, optical storage, flash memory devices, network attached storage (NAS), connections to storage area-network (SAN) devices, or to the cloud. The network interface 415 is configured to transmit data via the communications network 120.

The memory 425 may store a compiler 136. The compiler 136 compiles modules, which include source code or statements, into the object code, which includes machine instructions that execute on a processor. In one embodiment, the compiler 136 may translate the modules into an intermediate form before translating the intermediate form into object code. The compiler 136 may output a set of deployable artifacts that may include a set of processing elements and an application description language file (ADL file), which is a configuration file that describes the streaming application. In some embodiments, the compiler 136 may be a just-in-time compiler that executes as part of an interpreter. In other embodiments, the compiler 136 may be an optimizing compiler. In various embodiments, the compiler 136 may perform peephole optimizations, local optimizations, loop optimizations, inter-procedural or whole-program optimizations, machine code optimizations, or any other optimizations that reduce the amount of time required to execute the object code, to reduce the amount of memory required to execute the object code, or both.

The compiler 136 may also provide the application administrator with the ability to optimize performance through profile-driven fusion optimization. Fusing operators may improve performance by reducing the number of calls to a transport. While fusing stream operators may provide faster communication between operators than is available using inter-process communication techniques, any decision to fuse operators requires balancing the benefits of distributing processing across multiple compute nodes with the benefit of faster inter-operator communications. The compiler 136 may automate the fusion process to determine how to best fuse the operators to be hosted by one or more processing elements, while respecting user-specified constraints. This may be a two-step process, including compiling the application in a profiling mode and running the application, then re-compiling and using the optimizer during this subsequent compilation. The end result may, however, be a compiler-supplied deployable application with an optimized application configuration.

Figure 5:
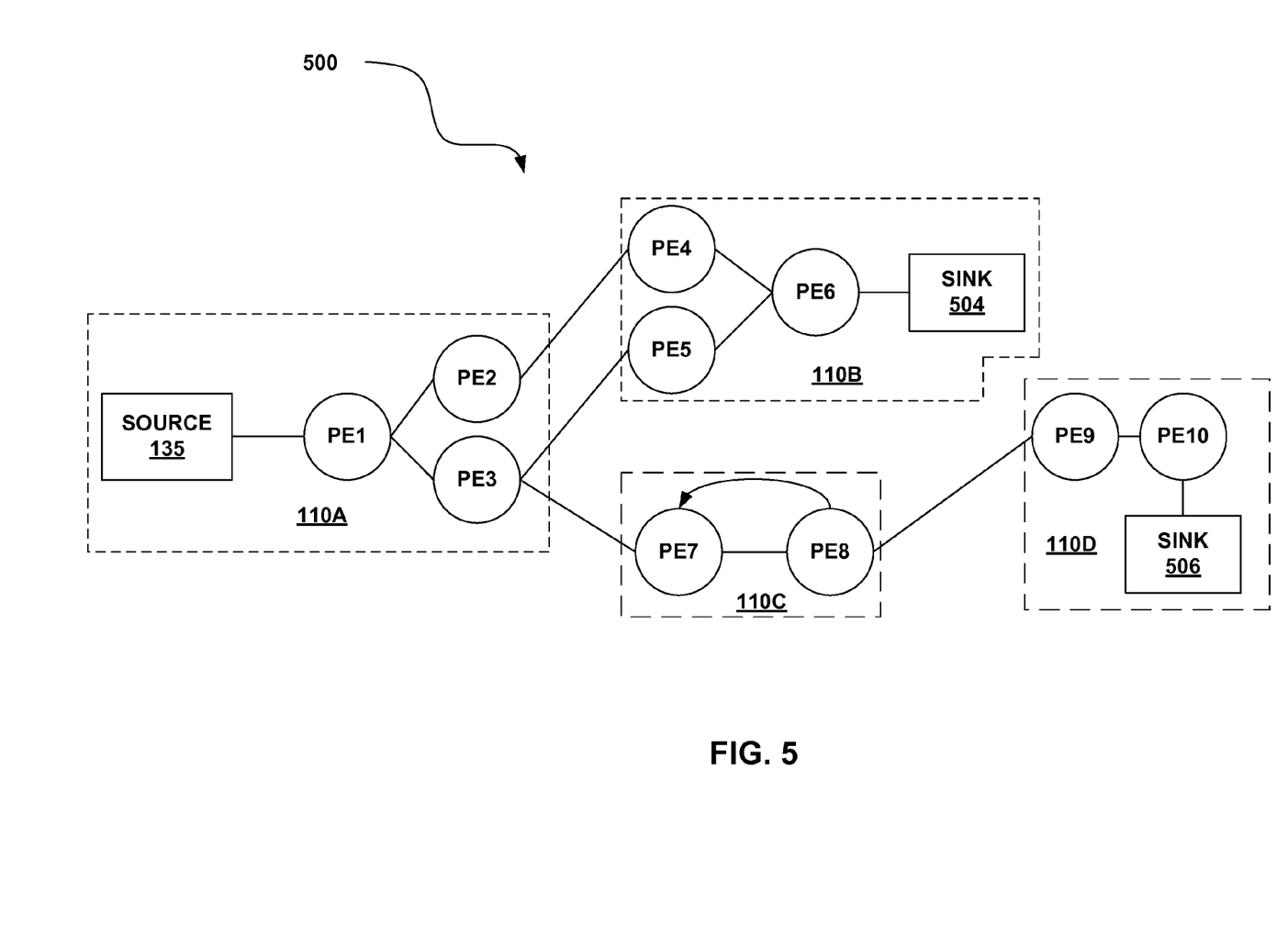
FIG. 5 illustrates an operator graph for a stream computing application according to various embodiments.

FIG. 5 illustrates an exemplary operator graph 500 for a stream computing application beginning from one or more sources 135 through to one or more sinks 504, 506, according to some embodiments. This flow from source to sink may also be generally referred to herein as an execution path. Although FIG. 5 is abstracted to show connected processing elements PE1-PE10, the operator graph 500 may include data flows between stream operators 240 (FIG. 2) within the same or different processing elements. Typically, processing elements, such as processing element 235 (FIG. 2), receive tuples from the stream as well as output tuples into the stream (except for a sink—where the stream terminates, or a source—where the stream begins).

The example operator graph shown in FIG. 5 includes ten processing elements (labeled as PE1-PE10) running on the compute nodes 110A-110D. A processing element may include one or more stream operators fused together to form an independently running process with its own process ID (PID) and memory space. In cases where two (or more) processing elements are running independently, inter-process communication may occur using a "transport," e.g., a network socket, a TCP/IP socket, or shared memory. However, when stream operators are fused together, the fused stream operators can use more rapid communication techniques for passing tuples among stream operators in each processing element.

The operator graph 500 begins at a source 135 and ends at a sink 504, 506. Compute node 110A includes the processing elements PE1, PE2, and PE3. Source 135 flows into the processing element PE1, which in turn outputs tuples that are received by PE2 and PE3. For example, PE1 may split data attributes received in a tuple and pass some data attributes in a new tuple to PE2, while passing other data attributes in another new tuple to PE3. As a second example, PE1 may pass some received tuples to PE2 while passing other tuples to PE3. Data that flows to PE2 is processed by the stream operators contained in PE2, and the resulting tuples are then output to PE4 on compute node 110B. Likewise, the tuples output by PE4 flow to operator sink PE6 504. Similarly, tuples flowing from PE3 to PE5 also reach the operators in sink PE6 504. Thus, in addition to being a sink for this example operator graph, PE6 could be configured to perform a join operation, combining tuples received from PE4 and PE5. This example operator graph also shows tuples flowing from PE3 to PE7 on compute node 110C, which itself shows tuples flowing to PE8 and looping back to PE7. Tuples output from PE8 flow to PE9 on compute node 110D, which in turn outputs tuples to be processed by operators in a sink processing element, for example PE10 506.

The tuple received by a particular processing element 235 (FIG. 2) is generally not considered to be the same tuple that is output downstream. Typically, the output tuple is changed in some way. An attribute or metadata may be added, deleted, or changed. However, it is not required that the output tuple be changed in some way. Generally, a particular tuple output by a processing element may not be considered to be the same tuple as a corresponding input tuple even if the input tuple is not changed by the processing element. However, to simplify the present description and the claims, an output tuple that has the same data attributes as a corresponding input tuple may be referred to herein as the same tuple.

Processing elements 235 (FIG. 2) may be configured to receive or output tuples in various formats, e.g., the processing elements or stream operators could exchange data marked up as XML documents. Furthermore, each stream operator 240 within a processing element 235 may be configured to carry out any form of data processing functions on received tuples, including, for example, writing to database tables or performing other database operations such as data joins, splits, reads, etc., as well as performing other data analytic functions or operations.

The stream manager 134 of FIG. 1 may be configured to monitor a stream computing application running on compute nodes, e.g., compute nodes 110A-110D, as well as to change the deployment of an operator graph, e.g., operator graph 132. The stream manager 134 may move processing elements from one compute node 110 to another, for example, to manage the processing loads of the compute nodes 110A-110D in the computing infrastructure 100. Further, stream manager 134 may control the stream computing application by inserting, removing, fusing, un-fusing, or otherwise modifying the processing elements and stream operators (or what tuples flow to the processing elements) running on the compute nodes 110A-110D. One example of a stream computing application is IBM®'s InfoSphere® Streams (note that InfoSphere® is a trademark of International Business Machines Corporation, registered in many jurisdictions worldwide).

Because a processing element may be a collection of fused stream operators, it is equally correct to describe the operator graph as one or more execution paths between specific stream operators, which may include execution paths to different stream operators within the same processing element. FIG. 5 illustrates execution paths between processing elements for the sake of clarity.

Figure 6:
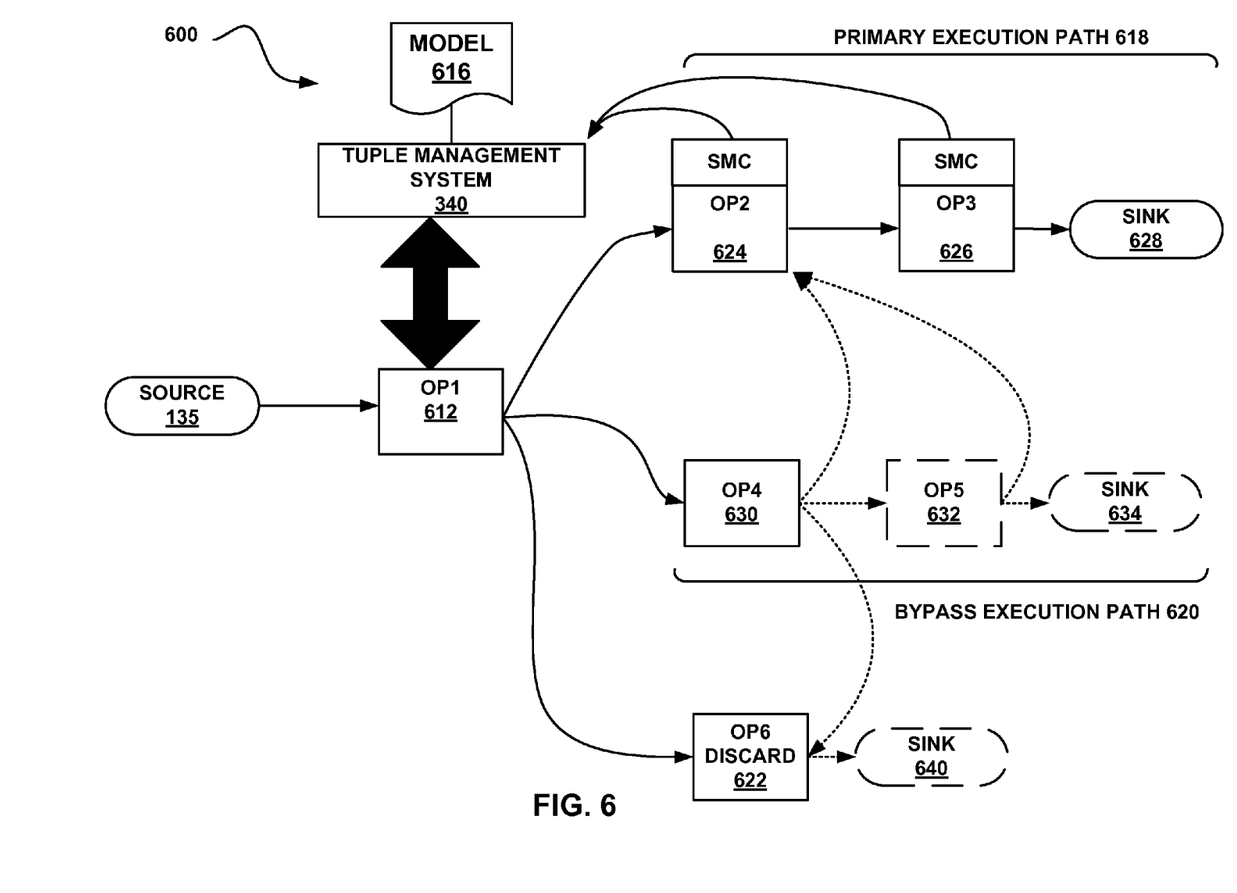
FIG. 6 illustrates a detection and sorting system for a poison tuple according to various embodiments.

FIG. 6 illustrates an operator graph 600 for identifying and routing poison tuples according to an embodiment. The operator graph 600 may correspond to the tuple management system (TMS) 340 on FIG. 3 which may be part of the stream manager 134. In some embodiments, the operator graph 600 may be distributed across part or all of the processing elements or compute notes on FIG. 5.

A stream operator 612 may be configured to perform a user-defined function and may be coupled to a tuple management system (TMS) 340 that may reside in the stream manager 134. The TMS 340 may detect and route poison tuples exclusively or share responsibility with the stream manager 134. In various embodiments, the TMS 340 may provide instructions to a particular operator that allows the particular operator to detect poison tuples. In other embodiments, the TMS 340 may provide instructions to a particular operator that allows the particular operator to detect potentially adverse, suspect poison tuples.

In some embodiments, the TMS 340 may be selectively enabled or disabled by a user. Examples of a user may include an application programmer, an end user of a system, or an administrator. In other embodiments, the TMS 340 may be disabled at the stream manager level 134 as a response to a parameter. In some embodiments, an example of a parameter may include a relatively fast processing time from a previously processed tuple that has a limited variance in attributes. In other embodiments, an example of a parameter may include a minimum number of tuples that are processed in the operator graph 600. In the shown examples, a relatively fast tuple processing time or a lack of tuples processed may limit the need for any tuple bypass paths (discussed below). In other embodiments, a parameter value may also be changed depending on the processing load. For example, if the processing load is relatively low, the parameter value may have a higher limit to allow tuples with a longer processing time.

In some embodiments, the TMS 340 may also receive a model 616 of possible errors or expected processing times above a threshold of a parameter. The model 616 provides data that allows the TMS 340 to form a prediction regarding which tuples will be potentially adverse or will likely become a poison tuple. An example of a tuple that will be potentially averse may be a sensor that is clearly reporting impossible data like a thermometer that reads 500 degrees Celsius for the outdoor air temperature after readings of 30 degrees Celsius. Although the terms predicting and prediction are used, the TMS 340 may also perform actions such as comparing parameters to form a comparison, evaluating parameters to form an evaluation, forecasting parameters to form a forecast, determining parameters to form a determination, or any combination thereof. It is intended through the use of the terms predicting and prediction to include the scope of such other terminology as well and without limitation.

The model 616 may be in the form of an XML document or any other format that the TMS 340 may reference to identify or predict a poison tuple or a suspect poison tuple. The model 616 may be in the form of user input parameters, or profile results created by operators from previous tuples with similar characteristics, but other configurations are contemplated. For example, the model 316 may feed into the TMS 340 when processing a tuple that has similar attributes to tuples previously processed by the operator graph 600. In the shown example, the TMS 340 may compare a predicted value for a parameter, which may be referred to as a prediction, such as processing time, with a threshold value for the parameter that may be established by a user. The predicted value for the parameter may be derived from the model 316 using profiled results from previous tuples, e.g., historical data. The model 316 may also contain the threshold value for the parameter, which may also be referred to as a parameter threshold, that may be established by a user.

The stream operator 612 may include additional tuple processing functions that may modify the tuples received from source 135. When the TMS 340 identifies a poison tuple or a suspect poison tuple by comparing against a threshold parameter value (such as in the example above), the stream operator 612 may associate an indication with the tuple. The indication may signal that one or more particular stream operators, e.g., operator 630, should not process this particular incoming tuple. In some embodiments, the indication may instruct one or more particular stream operators that the tuple is to remain in the data stream without being processed, such as in the bypass execution path 620, or discarded 622 entirely. In other embodiments, the indication may instruct one or more stream operators that the tuple is to remain in the data stream with limited processing. An example of limited processing may be a situation in which a stream operator may be configured with 2 or more processing operations, and only some of the operations are skipped. The indication may be associated with a tuple by adding or modifying header or trailer information for the tuple, such as, for example, metadata for the tuple. The indication may be a tuple, other than the poison tuple, that is output to the downstream stream operator indicating that the next tuple, next group of tuples, next tuples within a period of time, or combinations thereof, received should be processed, discarded 622, or sent along the bypass execution path 620, according to some embodiments.

In another embodiment, the stream operator 612 may associate an indication with one or more tuples when the requirement is a performance requirement or condition from the TMS 340. A performance requirement or condition may be, for example, a maximum duration of time within which a stream operator, e.g., stream operator 624, may be required to complete its processing. A performance requirement or condition may be associated with the model and may be based on historical data. In other embodiments, a performance requirement or condition may be a maximum number of exceptions that can occur, a maximum number of iterations a process may run, or other similar performance-based criteria.

In an embodiment, once a tuple is output from the "first" stream operator 612, the tuple may be transmitted to a "second" stream operator in one of three execution paths. The tuple may be transmitted to the primary execution path 618, and if an indication is present, the bypass execution path 620, or be discarded 622 in various embodiments. The primary execution path 618 may contain stream operators 624 and 626. The bypass execution path may contain stream operators 630, and 632. Execution paths may, for example, complete different types of processing on a given tuple, or they may process different attributes of a given tuple. In some embodiments, the primary execution path 618 may be the only execution path, but in others, the bypass execution path 620 may be the only execution path. In some embodiments, the operator graph 600 may have more than three execution paths. In other embodiments, the operator graph may have fewer than three execution paths.

Execution paths 618 and 620 may run independently of each other, but their respective operators may still be hosted on the same compute nodes that support the stream computing application. Stream operators from different execution paths, 618, 620, may share the same network interface 215, memory 225, or CPU 205, of the compute node 110 as shown in FIG. 2. In another embodiment, a stream operator on the operator graph 600 may be configured to further communicate with the TMS 340.

According to some embodiments, an input data stream may be received by the "first" stream operator 612 from the source 135. If the operator 612 does not detect a poison tuple or a tuple suspected of being poison, then the data stream may transmit an output tuple to the primary execution path 618. Stream operators, 624, 626, may process the tuples from the input data stream. In the shown embodiment, all operators may contain stream management code which may transmit performance data to the TMS 340. In other embodiments, for example, the performance data may be transmitted to the stream operator 612, directly to the model 616, or other locations where performance data may be recorded. The TMS 340 may incorporate the performance data into the model 616 in order to identify poison tuples. For example, if the model 616 indicates that a tuple processes too slowly, either operator 624 or 626 may transmit the tuple to the alternate execution path 620 or discard 622 the tuple depending on a threshold programmed by a particular user.

The TMS 340 may detect poison tuples using the model 616, which may produce a requirement for the operator 612 to associate an indication. If the TMS 340 detects a poison tuple, then the tuple may be transmitted to the alternate execution path 618 or discarded 622, according to the associated indication. The requirements may be based upon a parameter. The parameter may be a projected processing time, a time limit, a processing load including availability of other resources, the perceived importance of the data, or whether a tuple may cause a fatal error, but other configurations are contemplated. The requirements may also be user defined. For example, if the processing time at a particular stream operator along execution path 618 is 1 ms, a user may want to discard 622 any tuples that take over 4 ms to process. Alternatively, in this example, a user may want to process tuples that take between 1 ms and 4 ms along the alternate execution path 620.

The alternate execution path 620 may receive output tuples from stream operator 612. The alternate execution path 620 may include operators 630 and 632. The output of stream operator 630 may become the input for stream operator 632. Stream operator 630 may refer to the TMS 340 to determine whether a requirement exists for one or more particular stream operators to output the particular tuple without processing it. The output tuple from operator 632 may be transmitted to the sink 634.

Poison tuples may also be rehabilitated. During rehabilitation, certain attributes of a poison tuple may be discarded by either operator 630 or 632. Attributes of a poison tuple may be further analyzed by the stream operator 612. For example, a photograph of a license plate may be enhanced by a particular stream operator to transmit to a particular transcription stream operator. In this instance, stream operator 630 or stream operator 632 may further transmit a rehabilitated poison tuple to the primary execution path 618.

In another embodiment, the TMS 340 may determine that the tuple from stream operator 630 may cause a fatal error or otherwise cannot be processed and may discard the tuple. A discarded tuple may be further transmitted to a sink 640. The sink 640 may, for example, write the tuple values to a memory in some embodiments. A user may be able to take action on the discarded tuple or list of discarded tuples.

Figure 7:
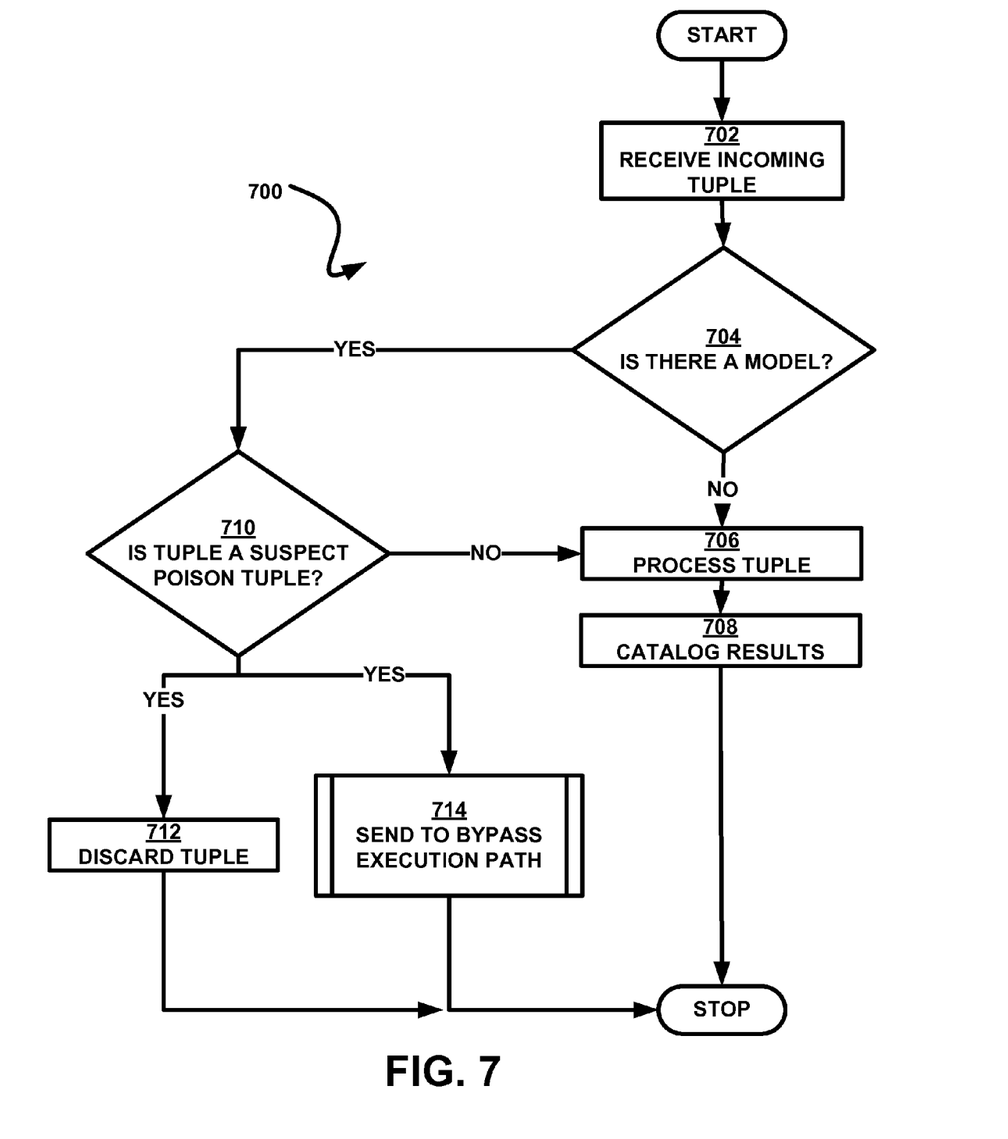
FIG. 7 illustrates a flow diagram of the detection of sorting system of FIG. 6 according to various embodiments.

FIG. 7 illustrates a method 700 for detecting and sorting poison tuples in a streaming application. For purposes of illustration, an example of a tollbooth tracking cars and people will be used throughout the discussion of the embodiment. The method 700 begins at operation 702. At operation 702, a stream operator 612 may receive the tuple. The stream operator 612 may refer to the TMS 340 to determine if the tuple is a poison tuple or a suspect poison tuple. The stream operator 612 may be a stream operator that may reside on the compute node, e.g., compute notes 110. For example, in the tollbooth illustration, if the user wants to determine how many cars other than red cars pass through a particular tollbooth, the user may write this as a function of the stream operator 612. Once the tuple is received, the stream operator 612 may look for a model 616 in operation 704. The model 616 may be a process or library that the TMS 340 may use to predict which tuples may be suspect poison tuple. The model 616 may also contain a predictive process or, in other embodiments, the model 616 may be a predictive data matrix.

If there is no model 616, or if the model 616 does not indicate a poison tuple, a tuple may proceed to operation 706. In operation 706, the tuple may be processed along a primary execution path, e.g., primary execution path 618. The results may also be added to the model 616 in operation 708. In the tollbooth example, the TMS 340 may determine that the license plate attribute for a particular car may have taken longer to process through a stream operator than other tuples because it was not supported in the database. In this example, the performance data for the tuple with the unsupported license plate may be transmitted to the TMS 340 and may be added to the model 616. In another embodiment, the performance data may be added to the model 616 directly.

In another embodiment, if there is no model 616, the TMS 340 may simulate performance data. According to various embodiments, the TMS 340 may simulate performance data by processing the tuple along the primary execution path 618 in a limited processing configuration, for example, by skipping processing by some operators. The TMS 340 may compile performance data from the operators used to process the tuple into the model 616 or may use the simulation to directly predict how the tuple will perform. The tuple may be transmitted to the sink 628 or reused in the operator graph 600 according to some embodiments.

If there is a model 616, the stream operator 612 may further determine if the tuple is a suspect poison tuple in operation 710. A tuple may be a suspect poison tuple if the attributes cause the processing element 610 to predict potentially adverse performance such as slower processing time compared to other tuples for the primary execution path 618. The TMS 340 may access the data from the model 616 to make a prediction of a parameter. The parameter may be a projected processing time, a time limit, a processing load, or whether the tuple would cause a fatal error but other configurations are contemplated. In the tollbooth illustration, for example, if a license plate from New York were scanned, the predictive data matrix may automatically indicate that standard license plates within the United States have had no prior issues and forward the tuple to operation 706. In another embodiment, the predictive data matrix may perform predicting functions based on historical data or user selected criteria. For example, in the tollbooth illustration, the predictive data matrix may note that there is a particular probability that a tuple containing a car with an unrecognized license plate, such as a vanity license plate or a dealer license plate, will slow down processing of the operator graph 600 based on all the cars containing unrecognized license plates. In the same example, the predictive data matrix may note that the particular probability is based on a small sample size and the user may choose to disregard the prediction.

Alternatively, the stream operator 612 may indicate that the tuple is poison, e.g., a car with an unrecognized license plate. The stream operator 612 may further determine if the tuple should be sent to operation 712 or operation 714. The decision to send the tuple to operation 712 or operation 714 may depend on parameters. For example, an operator may have a phonetic alphabet recognition algorithm but not a logographic, i.e., languages that use symbols, character recognition algorithm. Therefore, the stream operator 612 may transmit the unrecognized license plate with the phonetic characters to operation 714 but a logographic license plate may be sent to operation 712.

Figure 8:
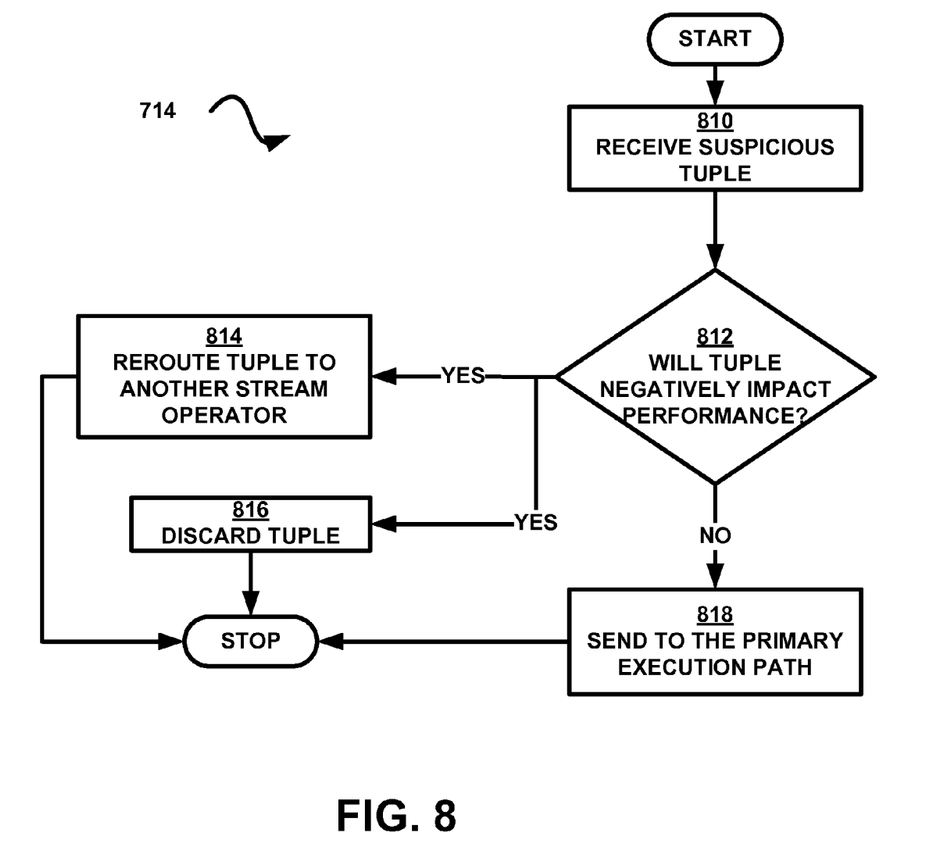
FIG. 8 illustrates a flow diagram of the alternate execution path of FIG. 7 according to various embodiments.

FIG. 8 illustrates operation 714 in FIG. 7 when a tuple may be transmitted to a bypass execution path, e.g., the bypass execution path 620. In operation 810, a suspect poison tuple is received by a stream operator 630. The stream operator 630 may further examine if the tuple may negatively impact performance in operation 812. In another embodiment, the TMS 340 may determine whether a suspect poison tuple negatively impacts system performance. Using the tollbooth example as an illustration, if tuples containing dealer license plates typically have an average processing time of 12 ms and tuples containing standard US license plates have an average processing time of 2 ms, then the stream operator 630 may predict that a tuple containing a dealer license plate may have a processing time of 12 ms and route to another stream operator, such as stream operator 632. In operation 814, a stream operator, e.g., stream operator 632, may try to rehabilitate a tuple with attribute of the dealer license plate by identifying the characters on the license plate along with an indication. The indication may note that the license plate is unrecognized and may bypass a particular operator without processing it further. The indication may also associate an image file of the license plate attribute and transmit the rehabilitated tuple to operator 624.

If a tuple is unrecognizable, such as a license plate that is blurry in the previously mentioned example, then the tuple may proceed according to operation 816. In operation 816, the tuple may be removed from the stream operator 630 and transmitted to stream operator 622.

In operation 812, the stream operator, such as stream operator 630, may determine that the tuple may not negatively impact performance of the operator graph 600 by further analysis. For example, if a license plate in the prior example was photographed at a wrong visual angle, then the stream operator 630 may determine that the stream operator 624 may be able to transcribe the license plate number using a transcription capability even though the license plate may be at a different visual angle.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination thereof. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination thereof. In the context of this disclosure, a computer readable storage medium may be any tangible medium that can contain, or store, a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination thereof.

Computer program code for carrying out operations for aspects of the present disclosure may be written in any combination of one or more programming languages, including: (a) an object oriented programming language such as Java, Smalltalk, C++, or the like; (b) conventional procedural programming languages, such as the "C" programming language or similar programming languages; and (c) a streams programming language, such as IBM Streams Processing Language (SPL). The program code may execute as specifically described herein. In addition, the program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure have been described with reference to flowchart illustrations, block diagrams, or both, of methods, apparatuses (systems), and computer program products according to embodiments of this disclosure. It will be understood that each block of the flowchart illustrations or block diagrams, and combinations of blocks in the flowchart illustrations or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions or acts specified in the flowchart or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function or act specified in the flowchart or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions or acts specified in the flowchart or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

Although embodiments are described within the context of a stream computing application, this is not the only context relevant to the present disclosure. Instead, such a description is without limitation and is for illustrative purposes only. Of course, one of ordinary skill in the art will recognize that embodiments of the present invention may be configured to operate with any computer system or application capable of performing the functions described herein. For example, embodiments of the invention may be configured to operate in a clustered environment with a standard database processing application.

While the foregoing is directed to exemplary embodiments, other and further embodiments of the invention may be devised without departing from the basic scope thereof, and the scope thereof is determined by the claims that follow.

What is claimed is:

1. A method for processing a stream of tuples, comprising:
receiving a stream of tuples to be processed by a plurality of processing elements operating on one or more computer processors, wherein one or more poison tuples from the stream of tuples has one or more attributes with values that cause adverse performance in a processing element;
generating a model of performance for processing the stream of tuples at runtime;
predicting a parameter of the one or more poison tuples from the stream of tuples, the parameter indicating a potential of a processing element for adverse performance when processing one or more poison tuples, the predicting including using the model; and
modifying processing of the one or more poison tuples if the parameter falls outside a parameter threshold.

2. The method of claim 1, wherein the parameter indicates actual adverse performance of the poison tuple.

3. The method of claim 1, the modifying further comprising routing the poison tuple to a bypass execution path.

4. The method of claim 3, the bypass execution path further comprising rehabilitating the poison tuple.

5. The method of claim 4, wherein rehabilitating the poison tuple includes discarding an attribute of the poison tuple.

6. The method of claim 1, the modifying further comprising discarding the poison tuple.

7. The method of claim 1, each processing element having one or more stream operators, wherein generating the model includes:

recording performance data for the stream of tuples from the one or more stream operators; and adding the performance data to the model.

8. The method of claim 1, wherein the parameter threshold is user-defined.

9. The method of claim 1, wherein the predicting of the parameter occurs through a simulation.

10. The method of claim 1, wherein the parameter is selected from the group of: a projected processing time of a stream operator, a time limit, a processing load of the stream operator, a perceived importance of the poison tuple, and whether the poison tuple may cause a fatal error within the stream operator.

11. The method of claim 1, wherein the modifying the processing includes associating an indication with the poison tuple, wherein indication signals that one or more particular stream operators should not process the poison tuple.

12. The method of claim 11, wherein the associating the indication includes: adding a header information for the poison tuple.

13. The method of claim 11, wherein the associating the indication includes: adding a performance requirement that indicates a maximum duration of time within which a stream operator is required to complete processing of the poison tuple.

14. The method of claim 1, wherein the parameter threshold is based on performance of a stream operator from a processing element.

* * * * *